(12) United States Patent
Higashibata

(10) Patent No.: US 9,553,048 B1
(45) Date of Patent: Jan. 24, 2017

(54) SEMICONDUCTOR DEVICE AND MANUFACTURING METHOD OF SEMICONDUCTOR DEVICE

(71) Applicant: Kabushiki Kaisha Toshiba, Minato-ku (JP)

(72) Inventor: Satomi Higashibata, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/979,662

(22) Filed: Dec. 28, 2015

Related U.S. Application Data

(60) Provisional application No. 62/214,596, filed on Sep. 4, 2015.

(51) Int. Cl.
| | |
|---|---|
| *H01L 27/00* | (2006.01) |
| *H01L 23/528* | (2006.01) |
| *H01L 27/115* | (2006.01) |
| *H01L 27/02* | (2006.01) |

(52) U.S. Cl.
CPC ....... *H01L 23/5283* (2013.01); *H01L 27/1157* (2013.01); *H01L 27/11524* (2013.01); *H01L 27/11556* (2013.01); *H01L 27/11582* (2013.01); *H01L 27/0207* (2013.01)

(58) Field of Classification Search
None
See application file for complete search history.

(56) References Cited

U.S. PATENT DOCUMENTS

| | | | | |
|---|---|---|---|---|
| 4,821,084 A | * | 4/1989 | Kinugasa | H01L 23/528 257/288 |
| 5,315,542 A | * | 5/1994 | Melzner | H01L 23/528 257/E23.151 |
| 5,566,104 A | * | 10/1996 | Shinkawata | G11O 5/02 365/149 |
| 6,026,010 A | * | 2/2000 | Ema | H01L 27/10805 257/E27.085 |
| 6,957,411 B1 | * | 10/2005 | Teig | G06F 17/5077 378/35 |
| 7,030,439 B2 | * | 4/2006 | Yun | H01L 27/0207 257/296 |

(Continued)

FOREIGN PATENT DOCUMENTS

| | | |
|---|---|---|
| JP | 2010-186833 | 8/2010 |
| JP | 2011-258822 | 12/2011 |
| JP | 5537205 | 7/2014 |

*Primary Examiner* — Evren Seven
(74) *Attorney, Agent, or Firm* — Oblon, McClelland, Maier & Neustadt, L.L.P.

(57) ABSTRACT

According to one embodiment, in a semiconductor device, a second contact is disposed at a position that is shifted from a first contact by a distance approximately of P in a first direction and by a distance approximately of $\sqrt{8} \times P$ in a second direction. A third contact is disposed at a position that is shifted from the first contact by a distance approximately of 2P in the first direction and by a distance approximately of $\sqrt{8} \times P/2$ in the second direction. A fourth contact is disposed at a position that is shifted from the first contact by a distance approximately of 3P in the first direction. A fifth contact is disposed at a position that is shifted from the fourth contact by a distance approximately of P in the first direction and by a distance approximately of $\sqrt{8} \times P$ in the second direction.

20 Claims, 11 Drawing Sheets

(56) References Cited

U.S. PATENT DOCUMENTS

| | | | |
|---|---|---|---|
| 8,288,812 B2 | 10/2012 | Kai et al. | |
| 9,142,538 B1 * | 9/2015 | Chen | H01L 27/0207 |
| 2004/0156255 A1 * | 8/2004 | Tsukikawa | G11C 11/404 |
| | | | 365/206 |
| 2006/0289914 A1 * | 12/2006 | Juengling | H01L 28/92 |
| | | | 257/296 |
| 2007/0296017 A1 * | 12/2007 | Mawatari | H01L 27/0207 |
| | | | 257/314 |
| 2009/0057743 A1 * | 3/2009 | Olligs | H01L 21/31144 |
| | | | 257/314 |
| 2010/0202181 A1 | 8/2010 | Hashimoto et al. | |
| 2011/0049601 A1 * | 3/2011 | Kai | H01L 21/76816 |
| | | | 257/315 |
| 2012/0070985 A1 * | 3/2012 | Hashimoto | G03F 1/50 |
| | | | 438/675 |
| 2015/0028422 A1 * | 1/2015 | Wu | H01L 27/088 |
| | | | 257/368 |
| 2015/0340371 A1 * | 11/2015 | Lue | H01L 21/28282 |
| | | | 257/324 |
| 2016/0254223 A1 * | 9/2016 | Smayling | H01L 21/027 |

* cited by examiner

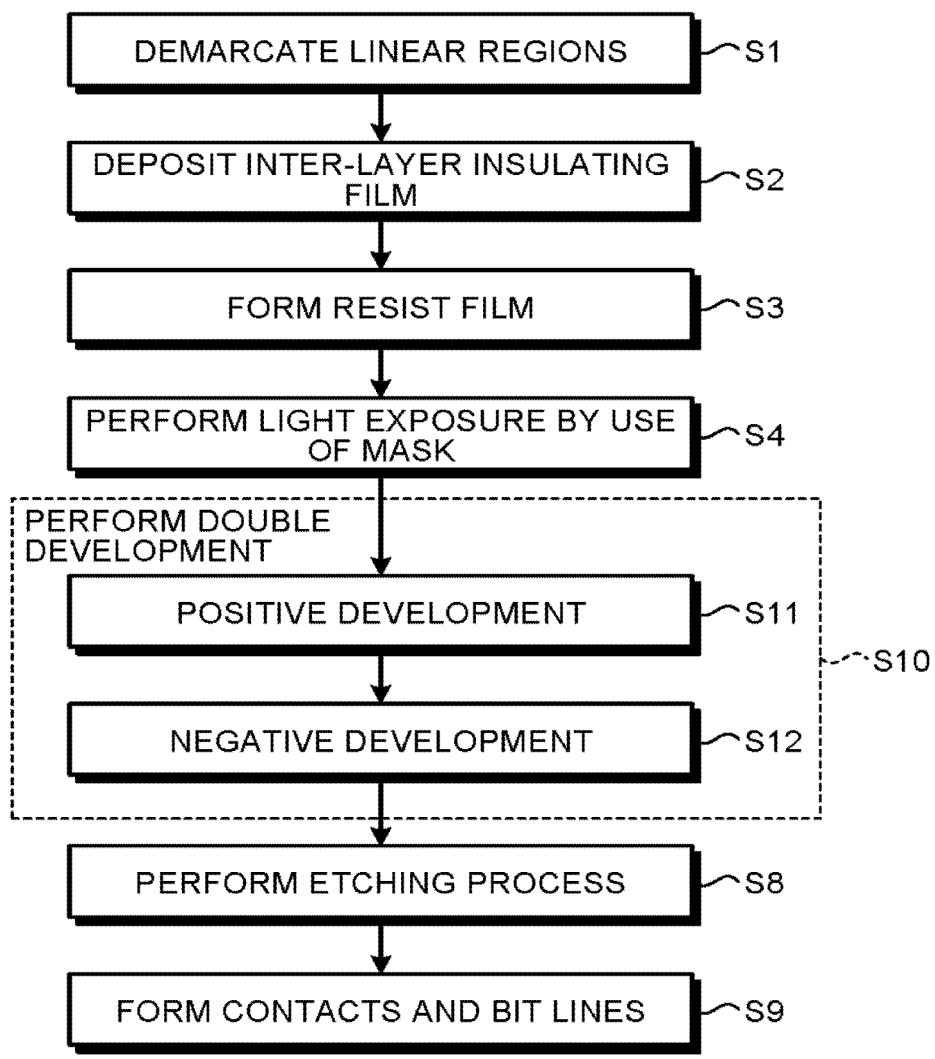

US 9,553,048 B1

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from U.S. Provisional Application No. 62/214,596, filed on Sep. 4, 2015; the entire contents of which are incorporated herein by reference.

FIELD

Embodiments described herein relate generally to a semiconductor device.

BACKGROUND

In a semiconductor device, such as a NAND type flash memory, patterns are being improved in terms of the degrees of miniaturization and integration. Along with such improvement, the semiconductor device is being desired to increase the arrangement density of contacts.

BRIEF DESCRIPTION OF THE DRAWINGS

FIG. 4 is a flow chart showing the manufacturing method of a semiconductor device according to the embodiment;

DETAILED DESCRIPTION

Figure 1:
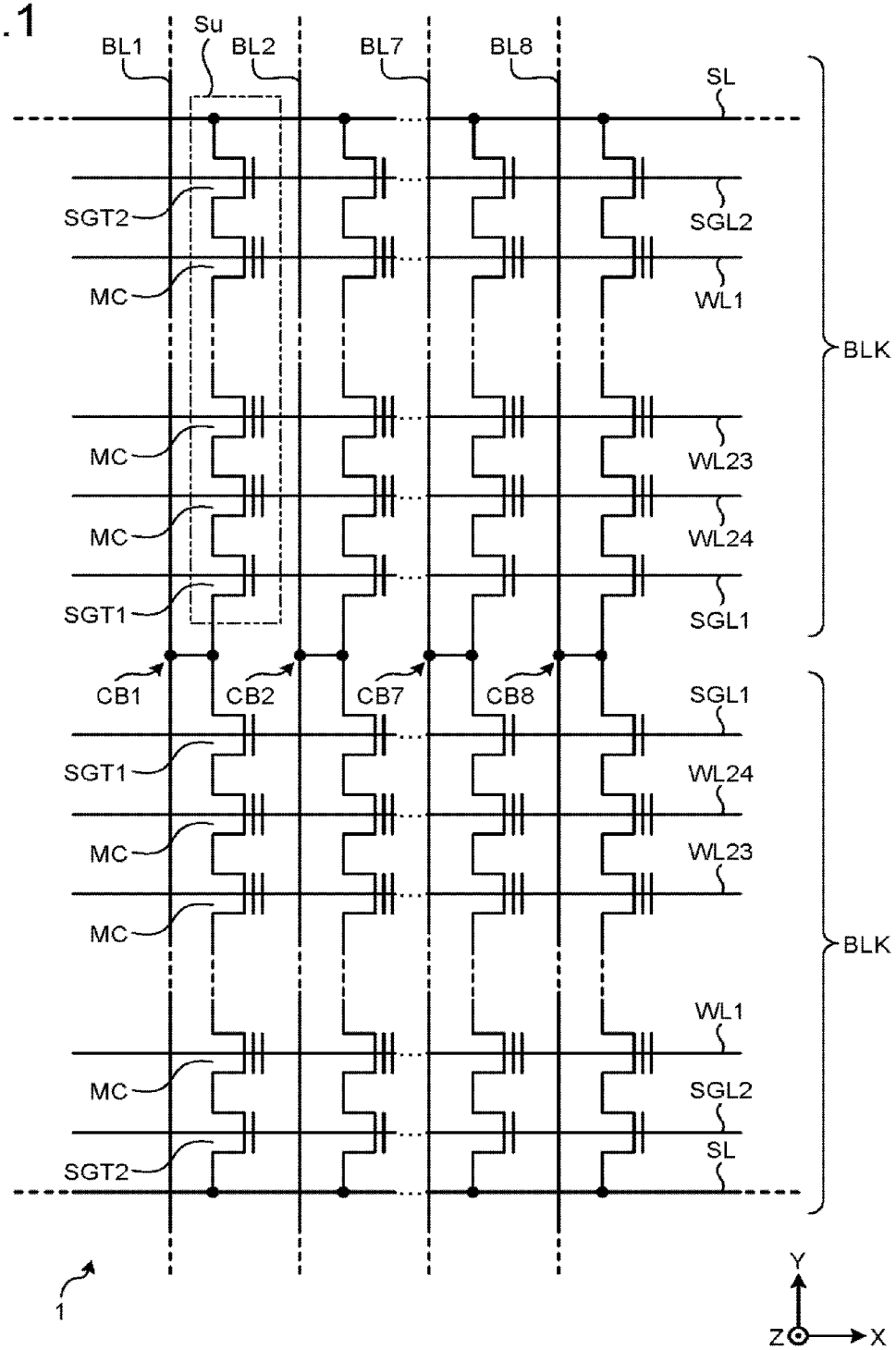
FIG. 1 is a circuit diagram showing a configuration of a semiconductor device according to an embodiment.

In general, according to one embodiment, there is provided a semiconductor device including a first line-shaped region, a second line-shaped region, a third line-shaped region, a fourth line-shaped region, a fifth line-shaped region, a first contact, a second contact, a third contact, a fourth contact, and a fifth contact. The second line-shaped region is juxtaposed to the first line-shaped region at a pitch approximately of P in a first direction. The third line-shaped region is juxtaposed to the second line-shaped region at a pitch approximately of P in the first direction. The fourth line-shaped region is juxtaposed to the third line-shaped region at a pitch approximately of P in the first direction. The fifth line-shaped region is juxtaposed to the fourth line-shaped region at a pitch approximately of P in the first direction. The first contact overlaps with the first line-shaped region when seen through in a direction perpendicular to a substrate. The second contact is disposed at a position that is shifted from the first contact by a distance approximately of P in the first direction and by a distance approximately of $\sqrt{8} \times P$ in a second direction. The second contact overlaps with the second line-shaped region when seen through in a direction perpendicular to the substrate. The third contact is disposed at a position that is shifted from the first contact by a distance approximately of 2P in the first direction and by a distance approximately of $\sqrt{8} \times P/2$ in the second direction. The third contact overlaps with the third line-shaped region when seen through in a direction perpendicular to the substrate. The fourth contact is disposed at a position that is shifted from the first contact by a distance approximately of 3P in the first direction. The fourth contact overlaps with the fourth line-shaped region when seen through in a direction perpendicular to the substrate. The fifth contact is disposed at a position that is shifted from the fourth contact by a distance approximately of P in the first direction and by a distance approximately of $\sqrt{8} \times P$ in the second direction. The fifth contact overlaps with the fifth line-shaped region when seen through in a direction perpendicular to the substrate.

Exemplary embodiments of a semiconductor device will be explained below in detail with reference to the accompanying drawings. The present invention is not limited to the following embodiments.

Embodiment

An explanation will be given of a semiconductor device according to an embodiment. In a semiconductor device, patterns are being improved in terms of the degrees of miniaturization and integration. For example, a semiconductor device, such as a NAND type flash memory, is mounted in many electronic apparatuses. Due to demands for multi-functionality of these electronic apparatuses, the semiconductor device is required to increase the storage capacity, and thus required to miniaturize storage elements.

For example, in the case of a NAND type flash memory, in general, a plurality of memory transistors are connected in series, and a NAND cell unit of the NAND type flash memory is thereby formed. Further, one end of the NAND cell unit is connected to a bit line through a selection gate transistor, and the other end is connected to a source line through another selection gate transistor.

For example, a semiconductor device 1 has the circuit configuration as shown in FIG. 1. FIG. 1 is a circuit diagram showing a configuration of the semiconductor device 1. As shown in FIG. 1, it is assumed that a direction substantially perpendicular to the surface of a semiconductor substrate 10 is a Z-direction, and two directions orthogonal to each other in a plane substantially perpendicular to the Z-direction are an X-direction and a Y-direction.

The memory cell array of the NAND type flash memory has a structure in which NAND cell units (memory units) Su are arranged in rows and columns on the substrate, and each NAND cell unit Su is composed of two selection gate transistors SGT1 and SGT2 and a plurality of (for example, $2^n$-number of (n is a positive integer)) memory cell transistors MC connected in series between these selection gate transistors SGT1 and SGT2. In each NAND cell unit Su, a plurality of memory cell transistors MC are formed such that adjacent transistors share a source/drain region. Further, a plurality of NAND cell units Su arrayed in the X-direction constitute one block BLK.

In each block BLK, the memory cell transistors MC arrayed in the X-direction are connected in common by a word line (control gate line) WL. Further, in each block BLK, the selection gate transistors SGT1 arrayed in the X-direction are connected in common by a selection gate line SGL1, and the selection gate transistors SGT2 arrayed in the X-direction are connected in common by a selection gate line SGL2. The drain regions of the selection gate transistors SGT1 are respectively connected to bit line contacts CB1 to CB8. The other ends of these bit line contacts CB1 to CB8 are respectively connected to bit lines BL extending in the Y-direction in FIG. 1. Further, the selection gate transistors SGT2 are connected through their source regions to a source line SL extending in the X-direction in FIG. 1.

It should be noted that, in the configuration shown here, two blocks BLK adjacent to each other in the Y-direction share the contacts (bit line contacts) CB1 to CB8. Thus, the structures inside the respective blocks BLK are in a state of mirror symmetry with each other relative to a center defined by the formation positions of the contacts CB1 to CB8. Further, in each block BLK shown in FIG. 1 as an example, the number of word lines is 24 and the number of bit lines is 8, but the number of word lines and the number of bit lines are not limited to these exemplifying numbers.

Figure 2:
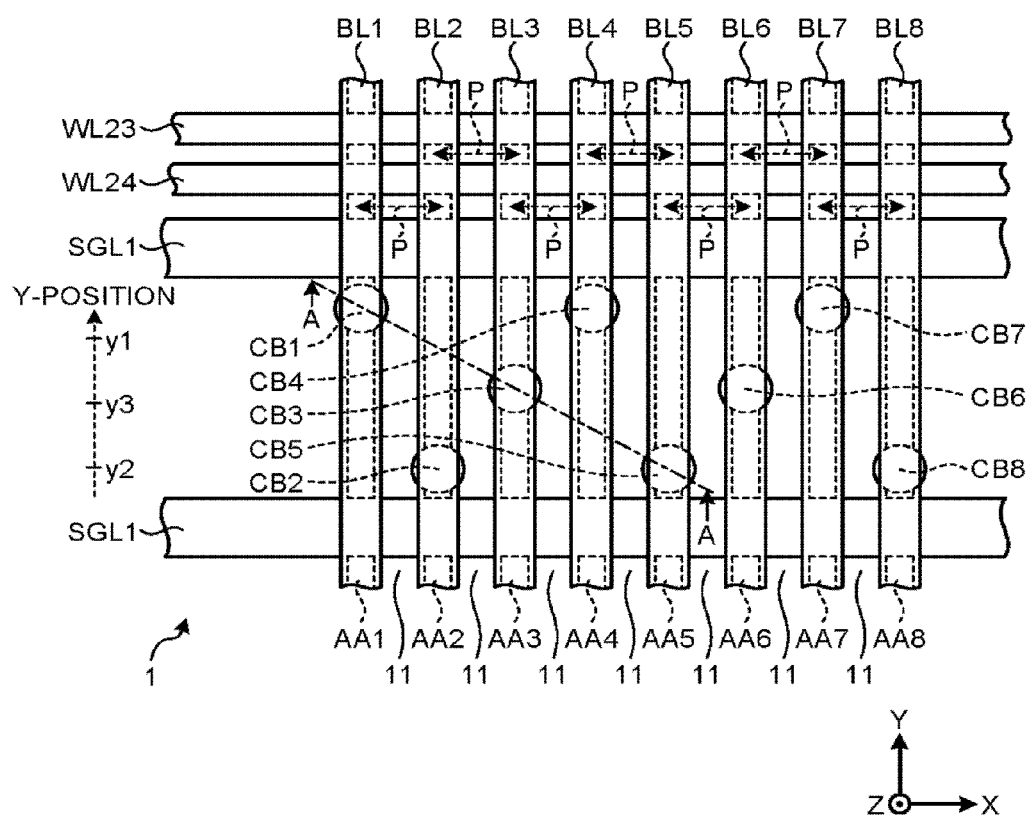
FIG. 2 is a plan view showing a configuration of the semiconductor device according to the embodiment.

The semiconductor device 1 has the layout configuration as shown in FIG. 2. FIG. 2 is a plan view showing a configuration of the semiconductor device 1.

The semiconductor device 1 includes a semiconductor substrate 10 (see FIG. 3A), a plurality of line-shaped regions AA1 to AA8, a plurality of word lines WL1 to WL24 (see FIG. 1), a plurality of contacts CB1 to CB8, and a plurality of bit lines BL1 to BL8.

The semiconductor substrate 10 (see FIG. 3A) is made of a semiconductor, such as silicon, for example. The semiconductor substrate 10 is formed with a plurality of element isolation portions 11 (see FIG. 3A) and the plurality of line-shaped regions AA1 to AA8. The element isolation portions 11 may be respectively formed of STI (Shallow Trench Isolation) type element isolation regions, or formed of LOCOS (local oxidation of silicon) type element isolation regions. The line-shaped regions AA1 to AA8 are respectively formed of active regions demarcated in the semiconductor substrate 10 by the element isolation portions 11. The line-shaped regions AA1 to AA8 linearly extend in the Y-direction shown in FIG. 2 (which will be simply referred to as "Y-direction"), and are mutually disposed side by side (for example, in parallel with each other). The plurality of line-shaped regions AA1 to AA8 are arrayed in the X-direction shown in FIG. 2 (which will be simply referred to as "X-direction").

The line-shaped region AA2 is juxtaposed to the line-shaped region AA1 at a pitch approximately of P in the X-direction. The line-shaped region AA3 is juxtaposed to the line-shaped region AA2 at a pitch approximately of P in the X-direction. The line-shaped region AA4 is juxtaposed to the line-shaped region AA3 at a pitch approximately of P in the X-direction. The line-shaped region AA5 is juxtaposed to the line-shaped region AA4 at a pitch approximately of P in the X-direction. The line-shaped region AA6 is juxtaposed to the line-shaped region AA5 at a pitch approximately of P in the X-direction. The line-shaped region AA7 is juxtaposed to the line-shaped region AA6 at a pitch approximately of P in the X-direction. The line-shaped region AA8 is juxtaposed to the line-shaped region AA7 at a pitch approximately of P in the X-direction.

The plurality of word lines WL1 to WL24 are arrayed such that they intersect with the plurality of line-shaped regions AA1 to AA8 when seen through in the Z-direction. Specifically, the word lines WL1 to WL24 extend in the X-direction, and are mutually disposed side by side (for example, in parallel with each other). The plurality of word lines WL1 to WL24 are arrayed in the Y-direction.

The plurality of contacts CB1 to CB8 serve as bit line contacts that electrically connect the plurality of line-shaped regions AA1 to AA8 respectively to the plurality of bit lines BL1 to BL8. The contacts (bit line contacts) CB1 to CB8 are shared by the two blocks BLK adjacent to each other in the Y-direction.

The contact CB1 overlaps with the line-shaped region AA1 when seen through in the Z-direction, and is electrically connected to the line-shaped region AA1. The contact CB2 overlaps with the line-shaped region AA2 when seen through in the Z-direction, and is electrically connected to the line-shaped region AA2. The contact CB3 overlaps with the line-shaped region AA3 when seen through in the Z-direction, and is electrically connected to the line-shaped region AA3. The contact CB4 overlaps with the line-shaped region AA4 when seen through in the Z-direction, and is electrically connected to the line-shaped region AA4. The contact CB5 overlaps with the line-shaped region AA5 when seen through in the Z-direction, and is electrically connected to the line-shaped region AA5. The contact CB6 overlaps with the line-shaped region AA6 when seen through in the Z-direction, and is electrically connected to the line-shaped region AA6. The contact CB7 overlaps with the line-shaped region AA7 when seen through in the Z-direction, and is electrically connected to the line-shaped region AA7. The contact CB8 overlaps with the line-shaped region AA8 when seen through in the Z-direction, and is electrically connected to the line-shaped region AA8.

The plurality of bit lines BL1 to BL8 are arrayed such that they respectively overlap with the plurality of line-shaped regions AA1 to AA8 when seen through in the Z-direction. Specifically, the bit lines BL1 to BL8 linearly extend in the Y-direction, and are mutually disposed side by side (for example, in parallel with each other). The plurality of bit lines BL1 to BL8 are arrayed in the X-direction.

The bit line BL1 overlaps with the line-shaped region AA1 and the contact CB1 when seen through in the Z-direction, and is electrically connected to the contact CB1. The bit line BL2 overlaps with the line-shaped region AA2 and the contact CB2 when seen through in the Z-direction, and is electrically connected to the contact CB2. The bit line BL3 overlaps with the line-shaped region AA3 and the contact CB3 when seen through in the Z-direction, and is electrically connected to the contact CB3. The bit line BL4 overlaps with the line-shaped region AA4 and the contact CB4 when seen through in the Z-direction, and is electrically connected to the contact CB4. The bit line BL5 overlaps with the line-shaped region AA5 and the contact CB5 when seen through in the Z-direction, and is electrically connected to the contact CB5. The bit line BL6 overlaps with the line-shaped region AA6 and the contact CB6 when seen through in the Z-direction, and is electrically connected to the contact CB6. The bit line BL7 overlaps with the line-shaped region AA7 and the contact CB7 when seen through in the Z-direction, and is electrically connected to the contact CB7. The bit line BL8 overlaps with the line-shaped region AA8 and the contact CB8 when seen through in the Z-direction, and is electrically connected to the contact CB8.

As regards the semiconductor device 1, along with miniaturization of the memory cell array, densification and integration of memories are advancing, and this advancement entails a requirement to reduce the size of the bit line contacts disposed between the drain-side selection gates. However, it is difficult to simply reduce the contact size and/or the space between the contacts, because there may be caused the following problems: Short-circuiting occurs between adjacent contacts; the breakdown voltage between the contacts is lowered; the contact resistance is increased due to miniaturization; and/or optical interference occurs during lithography due to a decrease in the distance between the contacts.

Zigzag arrangement of the contacts may be considered in order to secure the distance between the contacts in a case where the intervals between line-shaped regions or the intervals between bit lines, to which the contacts are to be electrically connected, are set smaller. As an example of a zigzag arrangement, there is a so-called double dot zigzag arrangement that uses a series of two contacts as the repetition unit in the zigzag layout structure, but the distance between adjacent contacts has become smaller along with advancement of miniaturization of memories, and so the various problems described above can be hardly avoided even by the double dot zigzag arrangement. In light of this, it may be considered to employ a so-called multiple dot zigzag arrangement that uses a series of three or more contacts as the repetition unit in the zigzag layout structure.

For example, according to this embodiment, as shown in FIG. 2, the contacts (bit line contacts) CB1 to CB8 are arranged in a triple dot zigzag arrangement. Specifically, within the region between the two selection gate lines SGL1, an arrangement position y1 set closer to one of the selection gate lines SGL1, an arrangement position y3 set closer to the other of the selection gate lines SGL1, and an arrangement position y2 set at the middle between the two selection gate lines SGL1 are periodically repeated. For example, while three bit lines consecutively arrayed in the X-direction are used as one unit (with a frequency of three bit lines), three contacts (bit line contacts) are respectively disposed at Y-positions of y1, y2, and y3. Specifically, the contacts CB1 to CB8 are sequentially disposed at Y-positions of y1→y2→y3→y1→y2→y3→y1→y2. In this layout, the segment corresponding to "y2→y3→y1" is arranged as a series of three dots in the zigzag arrangement.

However, if a multiple dot zigzag arrangement is simply adopted, the chip surface area may end up being increased by such an alteration of the layout that the interval between the two selection gate lines SGL1 is set larger to secure an arrangement area for the bit line contacts large enough in the Y-direction. For example, where 3P denotes an arrangement pitch at the resolution limit in association with a single development step, if the interval between the contacts CB1 and CB2 is set to 3P, the Y-direction distance between the contacts CB4 and CB3 can be expressed by $\sqrt{8}\times P/2$ (see FIG. 10). If the interval between the contacts CB3 and CB2 is set to 3P, the Y-direction distance between the contacts CB3 and CB2 can be expressed by $\sqrt{8}\times P/2$ (see FIG. 10). Accordingly, the chip surface area may end up being increased by such an alteration of the layout that the interval between the two selection gate lines SGL1 is set larger to secure an arrangement area for the bit line contacts to be $2\sqrt{8}\times P$ or more in the Y-direction. Thus, it is required to provide a contact arrangement that can suppress an increase in the chip surface area, while preventing short-circuiting between the contacts and suppressing a decrease in the breakdown voltage between the contacts.

In light of this, according to this embodiment, layout patterns on a mask to obtain bit line contacts are improved, and double development is performed by use of the improved layout patterns to form bit line contacts in a multiple dot zigzag arrangement, so that the contacts can be arranged at a pitch smaller than the resolution limit in association with a single development step.

Figure 5:
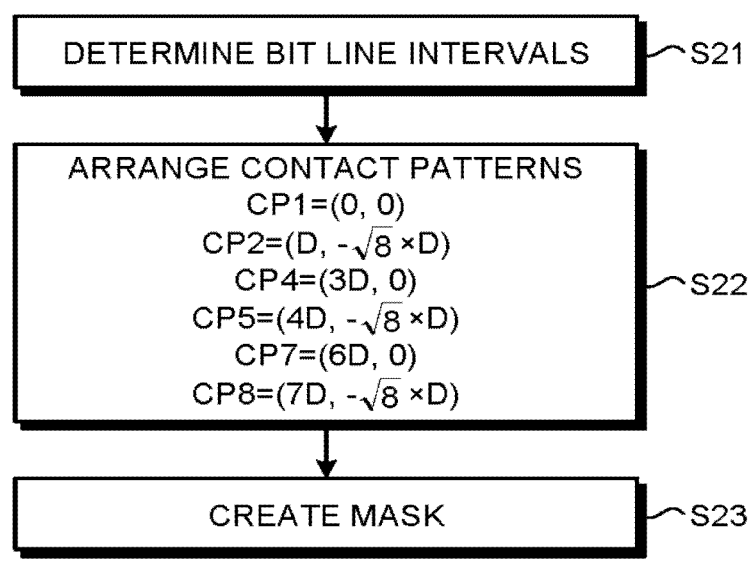
FIG. 5 is a view showing a mask pattern determination method according to the embodiment.
Figure 6:
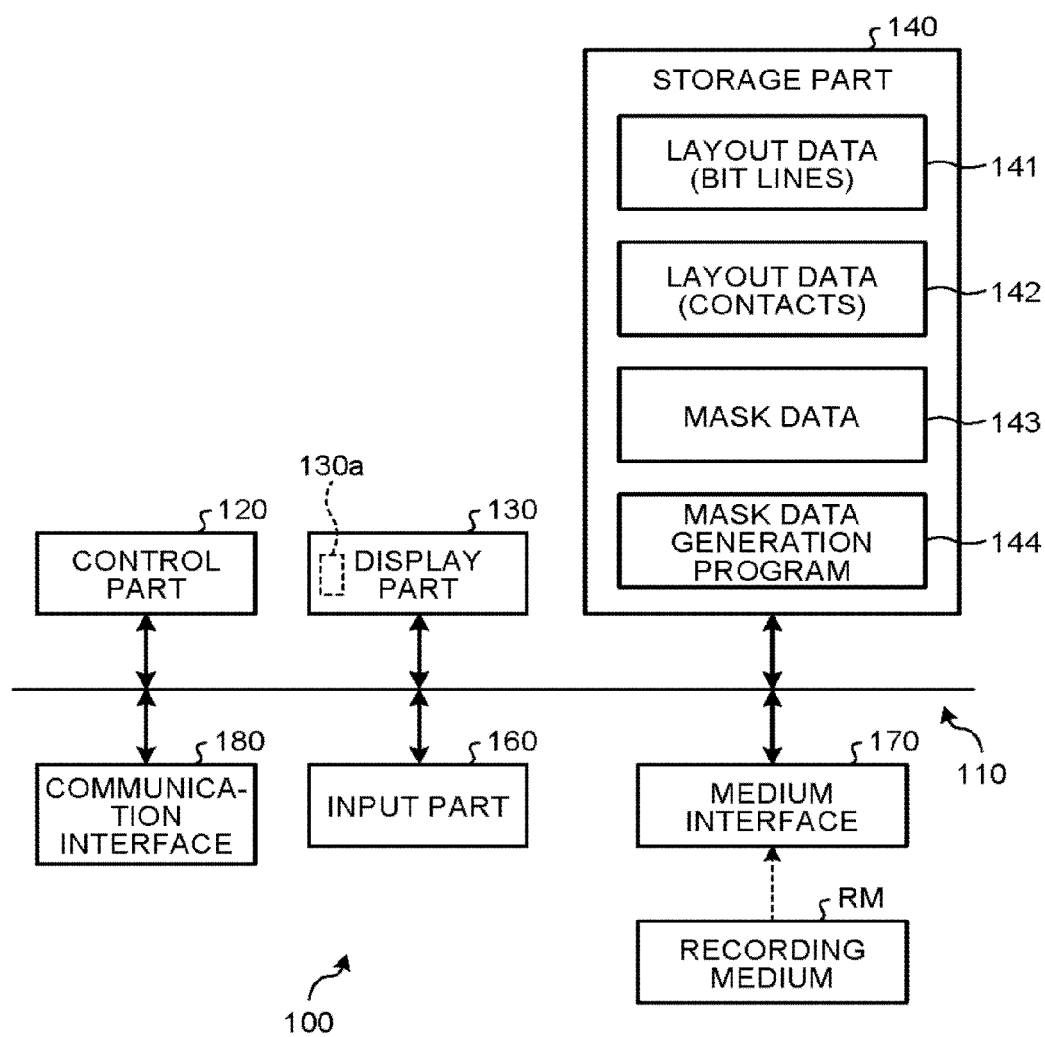
FIG. 6 is a view showing a configuration of a computer for executing a mask data generation program according to the embodiment.
Figure 7:
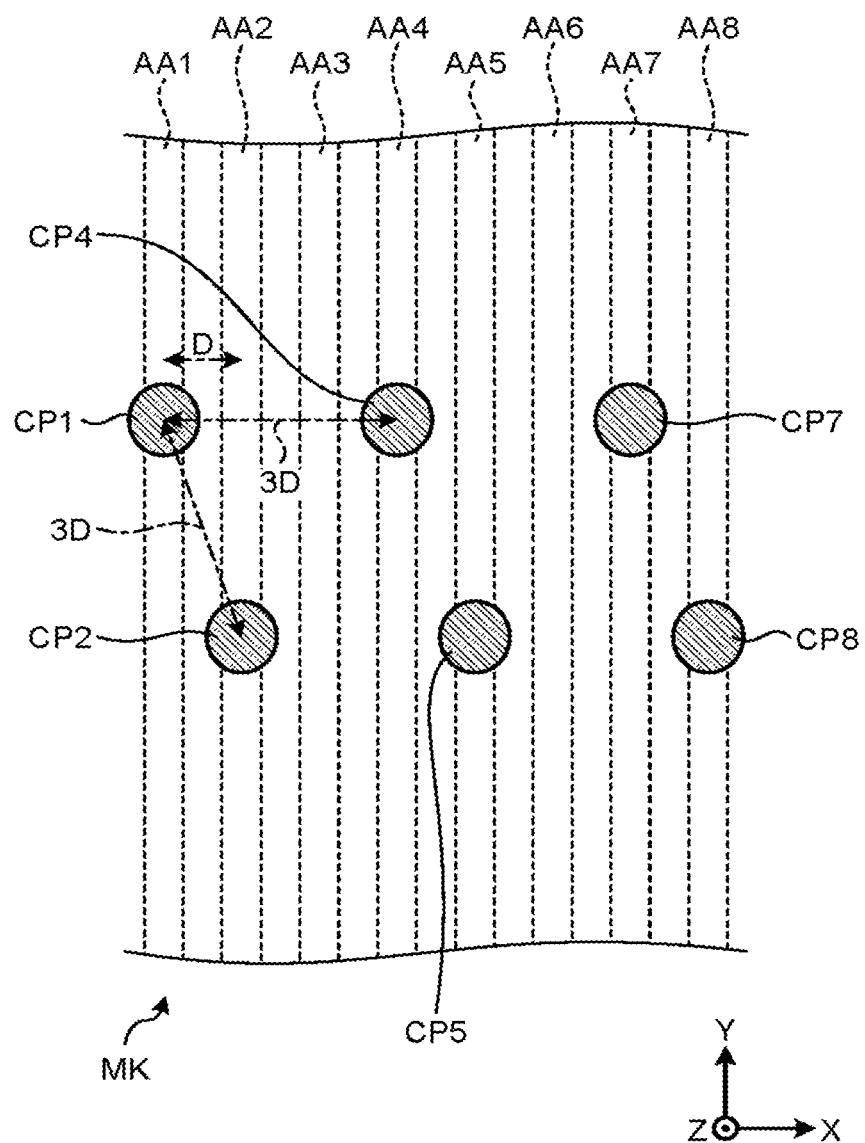
FIG. 7 is a view showing layout patterns on a mask according to the embodiment.
Figure 8:
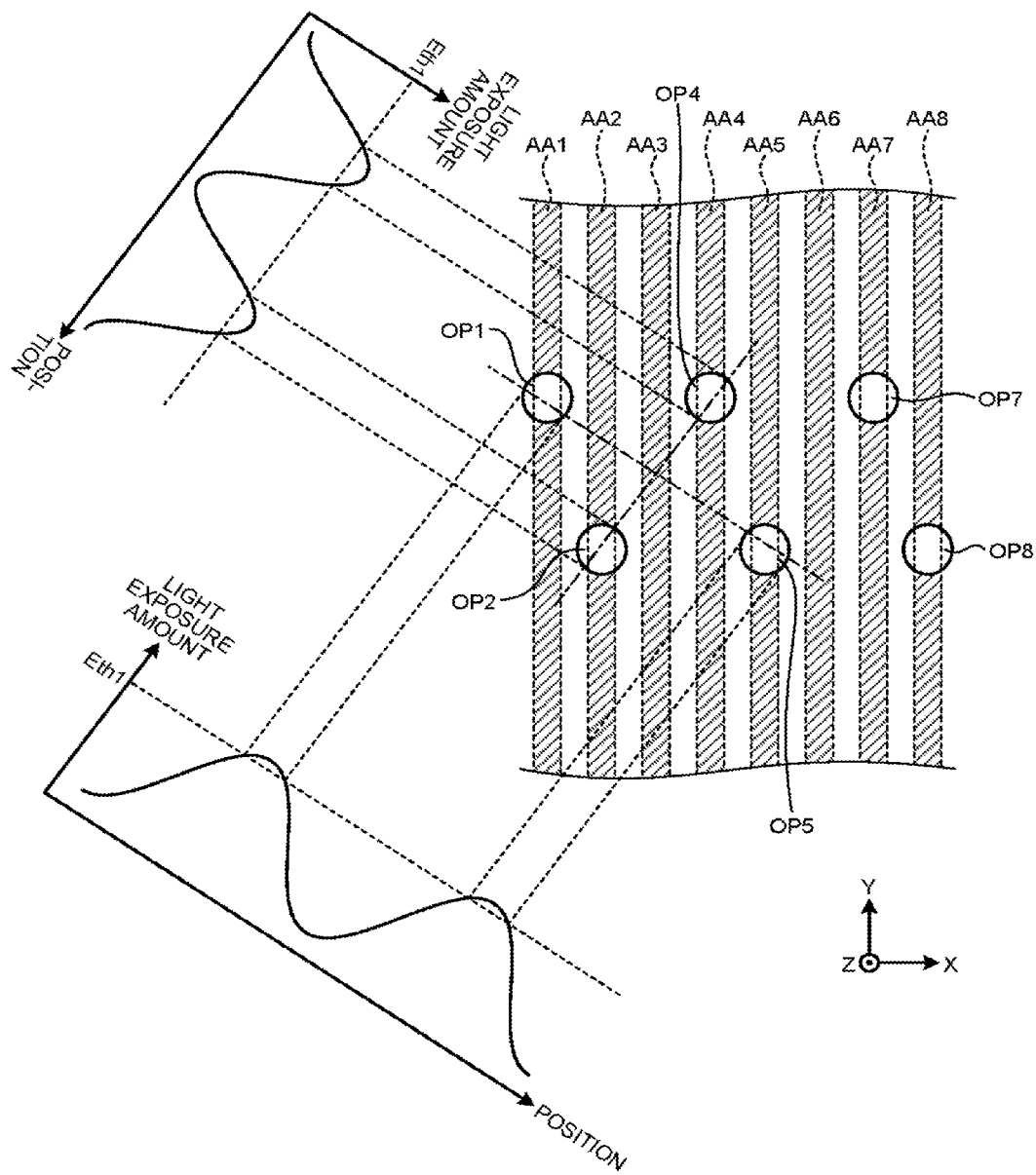
FIG. 8 is a view showing contacts obtained by double development (positive development) according to the embodiment.
Figure 9:
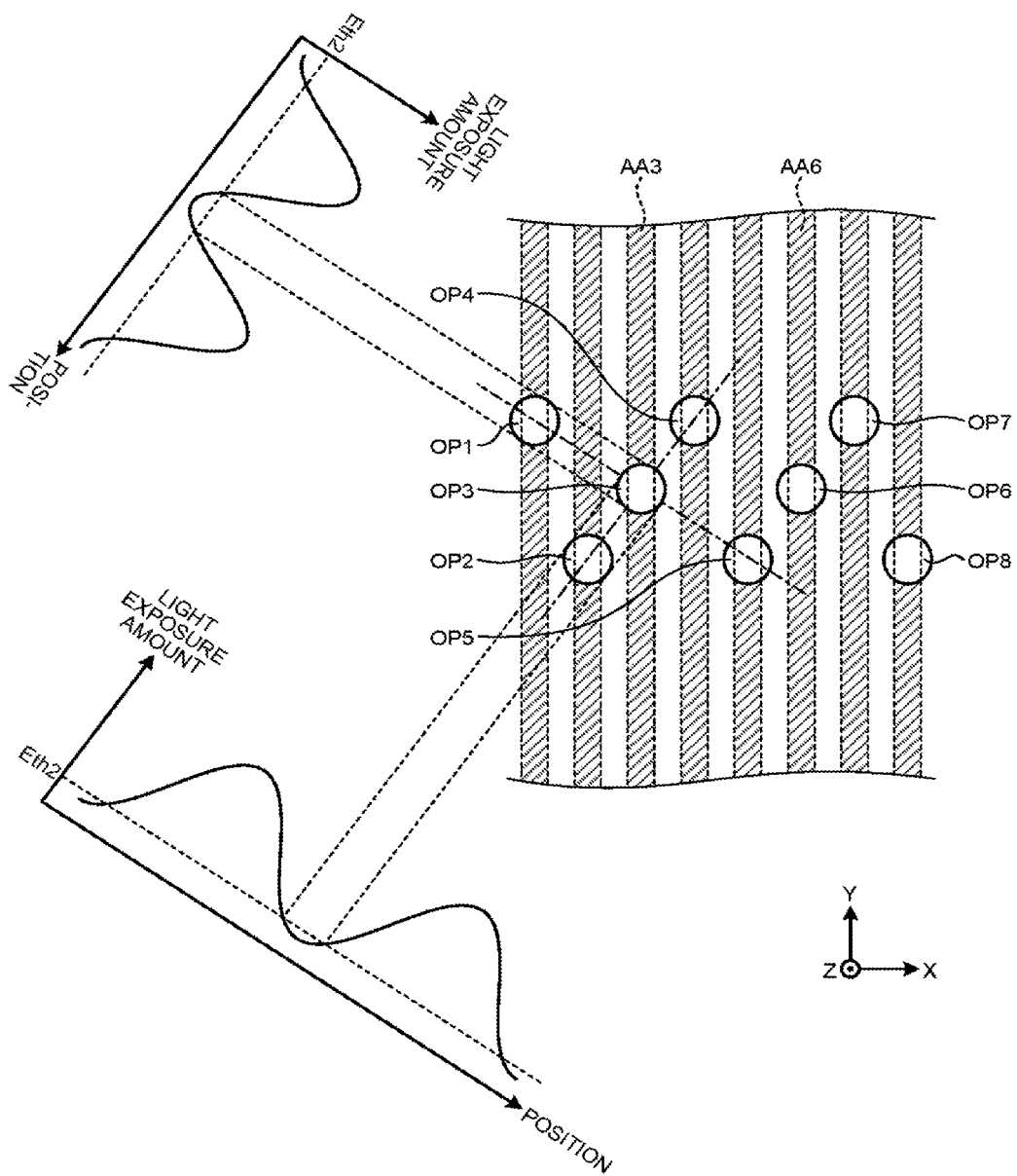
FIG. 9 is a view showing contacts obtained by double development (negative development) according to the embodiment.

More specifically, a semiconductor device 1 is manufactured as shown in FIGS. 3A to 9. FIGS. 3A to 3G are sectional views showing steps of a manufacturing method of the semiconductor device 1. Each of the step sectional views shown in FIGS. 3A to 3G corresponds to a sectional view taken along a line A-A of FIG. 2. FIG. 4 is a flow chart showing the manufacturing method of the semiconductor device 1. FIG. 5 is a flow chart showing a mask pattern determination method. FIG. 6 is a view showing a configuration of a computer for executing a mask data generation program. FIG. 7 is a view showing layout patterns on a mask according to the embodiment. FIG. 8 is a view showing contacts obtained by double development (positive development). FIG. 9 is a view showing contacts obtained by double development (negative development). FIGS. 8 and 9 omit illustration of the selection gate lines SGL1 and the word lines WL1 to WL24 for the sake of simplicity of the drawings.

Figure 3A:
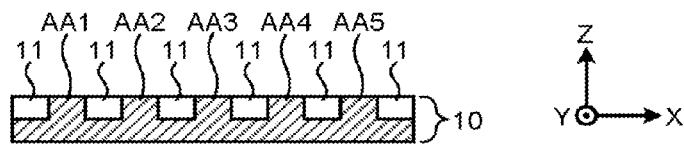
FIGS. 3A to 3G are sectional views showing steps of a manufacturing method of a semiconductor device according to the embodiment.

In the step shown in FIG. 3A, element isolation portions 11 are formed in a semiconductor substrate 10, such that they define patterns extending in the Y-direction as shown in FIG. 2. The element isolation portions 11 may be formed by use of an STI method, or by use of a LOCOS method. Consequently, a plurality of line-shaped regions AA1 to AA8 (see FIG. 2) are demarcated in the form of lines that respectively extend in the Y-direction (S1).

Figure 3B:
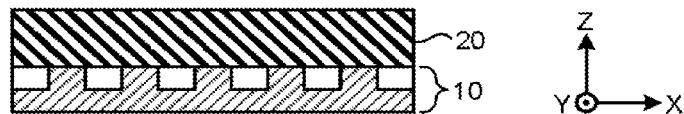

In the step shown in FIG. 3B, an inter-layer insulating film 20 is deposited on the semiconductor substrate 10 by use of a CVD method or the like (S2). The inter-layer insulating film 20 is made of silicon oxide, for example.

Figure 3C:
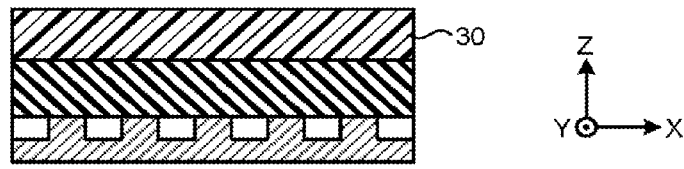

In the step shown in FIG. 3C, a resist (photosensitive material) is applied onto the inter-layer insulating film 20, and a resist film 30 is thereby formed (S3). As the material of the resist film 30, an ordinary resist may be used, and, for example, a chemical amplification type resist is used. The chemical amplification type resist employed here may be prepared such that a copolymer of p-t-butoxycarbonyl methoxystyrene and 4-hydroxystyrene is used as the resin, and triphenyl sulfonate is used as the acid generating agent, for example.

As shown in FIG. 6, a computer 100 is used to prepare a mask MK including the layout patterns as shown in FIG. 7. The mask MK includes light shielding patterns CP1, CP2, CP4, CP5, CP7, and CP8.

The computer 100 includes a bus wiring line 110, a control part 120, a display part 130, a storage part 140, an input part 160, a medium interface 170, and a communication interface 180.

The control part 120, the display part 130, the storage part 140, the input part 160, the medium interface 170, and the communication interface 180 are connected to each other via the bus wiring line 110. The medium interface 170 is configured to connect a recording medium RM. The communication interface 180 is configured to receive information from the outside via a wired communication line or wireless communication line.

The storage part 140 stores layout data 141 and 142, mask data 143, and a mask data generation program 144. The layout data 141 is layout data about the layer of bit lines. The layout data 142 is layout data about the layer of contacts (bit line contacts).

The control part 120 is formed of, for example, a CPU, GPU, DSP, or micro-controller, and further includes a cache memory for temporary storage. The display part 130 is formed of a display device, such as a CRT display and/or liquid crystal display, and includes a screen 130a. The storage part 140 is formed of, for example, a memory and/or hard disk. The input part 160 is formed of, for example, a keyboard and/or mouse. The medium interface 170 is formed of, for example, a flexible disk drive, CD-ROM drive, and/or USB interface. The recording medium RM is formed of a flexible disk, CD-ROM, and/or USB memory. The communication interface 180 is an interface formed in accordance with a standard of wired communication or wireless communication.

Specifically, the computer 100 receives designation of bit line intervals P through the input part 160, under a state where a layout editor or the like is being executed. In accordance with the designation of bit line intervals P, the computer 100 determines bit line intervals P (S21), and generates layout data 141 corresponding to the bit line intervals P. In accordance with the layout data 141 about the layer of bit lines, the computer 100 arranges contact patterns onto layout data 142 about the layer of contacts (S22). The arrangement positions of the respective light shielding patterns are determined such that the minimum distance between the respective light shielding patterns CP1, CP2, CP4, CP5, CP7, and CP8 is not smaller than the arrangement pitch 3P at the resolution limit, for example. For example, if the arrangement position of the light shielding pattern CP1 is set at the original point (0,0), the arrangement positions of the light shielding patterns CP2, CP4, CP5, CP7, and CP8 respectively become present at $(P,-\sqrt{8}\times P)$, $(3P,0)$, $(4P,-\sqrt{8}\times P)$, $(6P,0)$, and $(7P,-\sqrt{8}\times P)$ (see FIG. 10).

Then, the layout data 142, which shows determination contents about the arrangement positions of the respective light shielding patterns on the mask surface, is read out from the computer 100 and is input into a mask drawing apparatus (not shown). The mask drawing apparatus draws the light shielding patterns CP1, CP2, CP4, CP5, CP7, and CP8 on the mask substrate, and thereby creates the mask MK (S23). Where D denotes the distance corresponding to the intervals P on the mask surface, the minimum distance between the respective light shielding patterns CP1, CP2, CP4, CP5, CP7, and CP8 on the mask surface is set to 3D or more, for example. For example, as shown in FIG. 7, if the arrangement position of the light shielding pattern CP1 is set at the original point (0,0), the arrangement positions of the light shielding patterns CP2, CP4, CP5, CP7, and CP8 respectively become present at $(D,-\sqrt{8}\times D)$, $(3D,0)$, $(4D,-\sqrt{8}\times D)$, $(6D,0)$, and $(7D,-\sqrt{8}\times D)$.

It should be noted that, as indicated by broken lines in FIG. 7, the light shielding patterns CP1, CP2, CP4, CP5, CP7, and CP8 are respectively disposed at the positions on the mask surface which correspond to the line-shaped regions AA1, AA2, AA4, AA5, AA7, and AA8 (see FIG. 2). Here, the broken lines shown in FIG. 7 are used for reference, and such patterns are not formed on the actual mask surface. The light shielding patterns CP1, CP2, CP4, CP5, CP7, and CP8 are patterns corresponding to the contacts CB1, CB2, CB4, CB5, CB7, and CB8, which belong to the contacts CB1 to CB8 to be finally formed. The mask MK does not include light shielding patterns corresponding to the contacts CB3 and CB6. As indicated by the broken lines in FIG. 7, the mask MK does not include light shielding patterns at the positions on the mask surface which correspond to the line-shaped regions AA3 and AA6 (see FIG. 2).

A light exposure process is performed by use of an exposure apparatus (S4), so that the patterns on the mask MK are transferred onto the resist film 30. Consequently, latent image patterns are formed on the resist film 30. Specifically, a distribution of light exposure amount is formed on the resist film 30, as shown in FIG. 8.

Figure 3D:
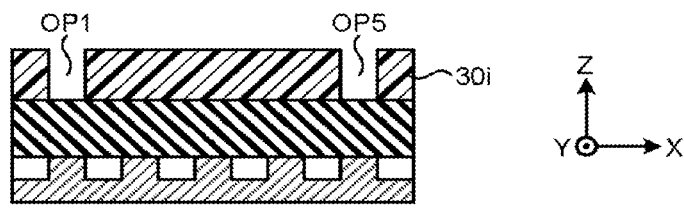
Figure 3E:
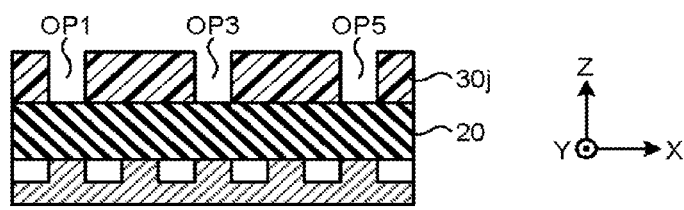

A post-exposure baking is performed at a predetermined temperature for a predetermined time, and then double development is performed, as shown in FIGS. 3D and 3E (S10). In this double development, positive development and negative development are performed. The positive development (S11) is performed by use of a first liquid developer, such that regions having a light exposure amount not smaller than a threshold value Eth1 (see FIG. 8) are developed, and positive type patterns are thereby formed. The negative development (S12) is performed by use of a second liquid developer, such that regions having a light exposure amount not larger than a threshold value Eth2 (see FIG. 9) are developed, and negative type patterns are thereby formed. In the resist film 30, regions having a light exposure amount larger than the threshold value Eth2 and smaller than the threshold value Eth1 are left behind.

In the step shown in FIG. 3D, development patterns corresponding to the contacts CB1, CB2, CB4, CB5, CB7, and CB8 are formed in a resist film 30i by use of the first liquid developer. The first liquid developer is a liquid developer to obtain positive type patterns, and may be made of an aqueous solution of tetramethylammonium hydroxide (TMAH), for example. The development using the first liquid developer is performed for, e.g., 30 seconds, and then a rinse using pure water is performed and spin drying is performed. Consequently, regions having a light exposure amount not smaller than the threshold value Eth1 (see FIG. 8) are removed from the resist film 30i, and, as shown in FIGS. 3D and 8, opening patterns OP1, OP2, OP4, OP5, OP7, and OP8 corresponding to the contacts CB1, CB2, CB4, CB5, CB7, and CB8 are formed as development patterns in the resist film 30i (S11). At this time, the minimum interval between the opening patterns OP1, OP2, OP4, OP5, OP7, and OP8 is not smaller than the resolution limit pitch 3P. For example, the interval between the opening pattern OP1 and the opening pattern OP2 is not smaller than the resolution limit pitch 3P.

In the step shown in FIG. 3E, development patterns corresponding to the contacts CB3 and CB6 are formed in a resist film 30j by use of the second liquid developer. The second liquid developer is a liquid developer to obtain negative type patterns, and may be made of a mixture solution consisting of anisole and methylisobutyl ketone (MIBK) mixed at a mixture ratio of 4:1, for example. The development using the second liquid developer is performed for, e.g., 60 seconds, and then a rinse using anisole is performed. Consequently, regions having a light exposure amount not larger than the threshold value Eth2 (see FIG. 9) are removed from the resist film 30j, and, as shown in FIGS. 3E and 9, opening patterns OP3 and OP6 corresponding to the contacts CB3 and CB6 are formed as development patterns in the resist film 30j (S12). At this time, the minimum interval between the opening patterns OP1 to OP8 becomes smaller than the resolution limit pitch 3P. For example, the interval between the opening pattern OP2 and the opening pattern OP3 is smaller than the resolution limit pitch 3P.

Figure 3F:
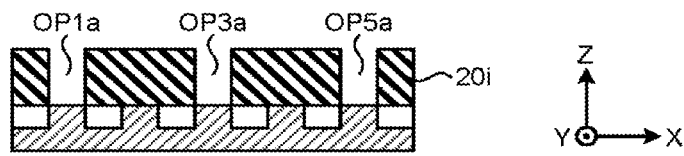

In the step shown in FIG. 3F, while the resist film 30j including the opening patterns OP1 to OP8 is used as the mask MK, an etching process is performed to the inter-layer insulating film 20 (S8). The etching process includes performing dry etching under conditions providing high anisotropy by use of an RIE method or the like. Consequently, the opening patterns OP1 to OP8 of the resist film 30j can be transferred onto the inter-layer insulating film 20, so that opening patterns OP1a to OP8a corresponding to the opening patterns OP1 to OP8 are formed in an inter-layer insulating film 20i.

Figure 3G:
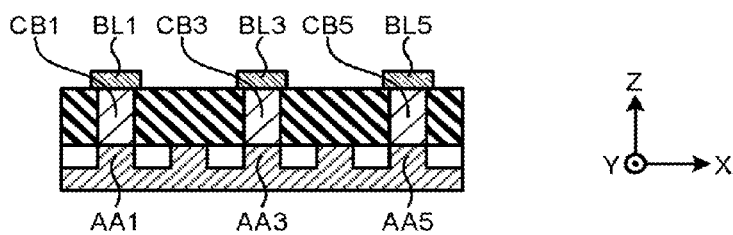

In the step shown in FIG. 3G, a conductive material is embedded into the opening patterns OP1a to OP8a of the inter-layer insulating film 20i, so that the contacts CB1 to CB8 (see FIG. 2) are formed (S9). The conductive material is a substance containing a metal, such as tungsten or copper, as the main component, for example. Thereafter, a conductive film is deposited and is subjected to patterning, so that a plurality of bit lines BL1 to BL8 respectively extending in the Y-direction (see FIG. 2) are formed (S9).

Figure 10:
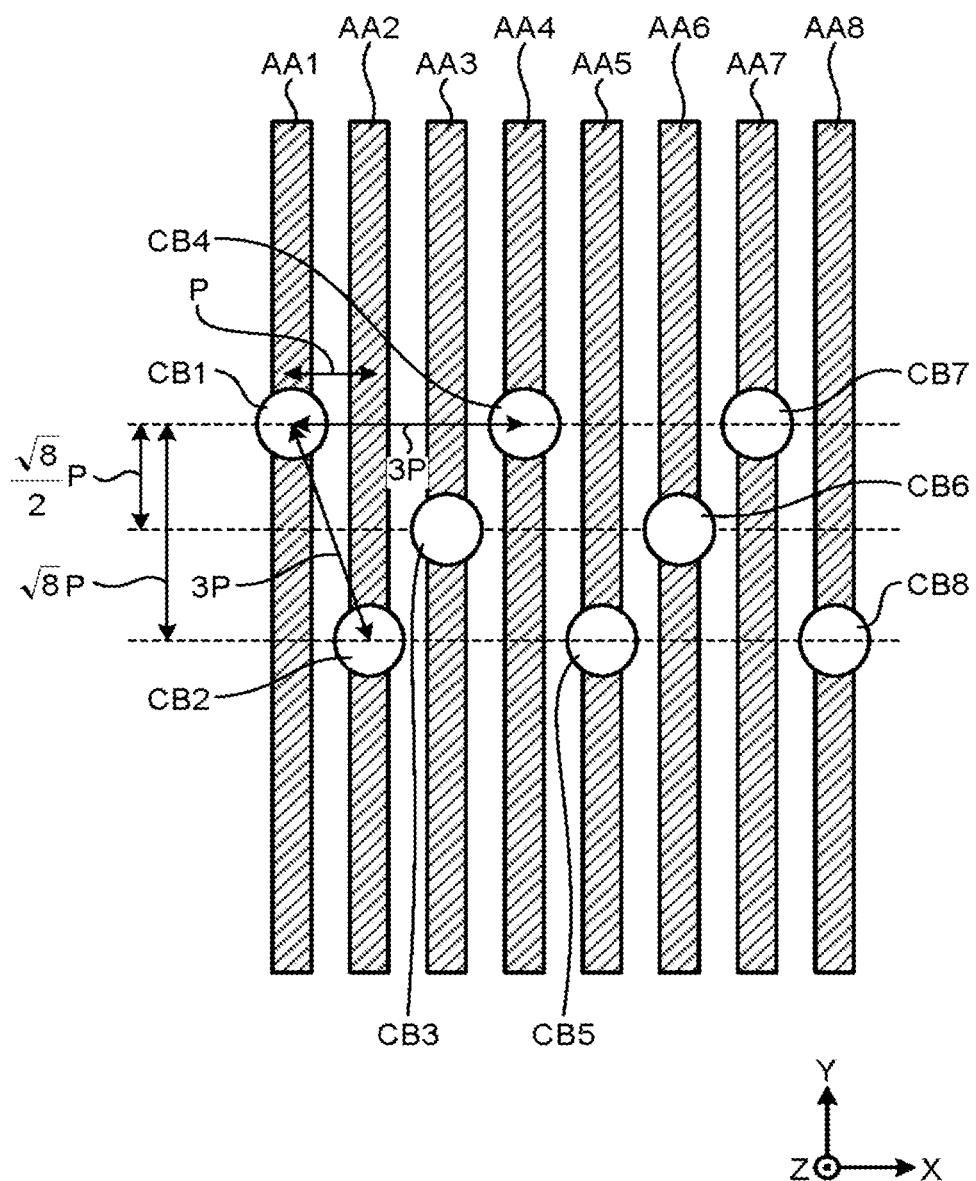
FIG. 10 is a plan view showing a layout configuration of contacts according to the embodiment.

Consequently, a semiconductor device 1 having the layout configuration as shown in FIG. 10 is obtained. FIG. 10 is a plan view showing a layout configuration of the contacts. FIG. 10 omits illustration of the selection gate lines SGL1 and the word lines WL1 to WL24 for the sake of simplicity of the drawings.

In the case that the plurality of bit lines BL1 to BL8 are arrayed at a pitch approximately of P in the X-direction (see FIG. 2), the plurality of line-shaped regions AA1 to AA8 respectively correspond to them and are arrayed at a pitch approximately of P in the X-direction.

The contact CB1 is disposed at a position overlapping with the line-shaped region AA1 when seen through in the Z-direction. The contact CB1 has a substantially elliptical shape whose major axis is set along the Y-direction, for example.

The contact CB2 is disposed at a position that is shifted from the contact CB1 by a distance approximately of P in the X-direction and by a distance approximately of $\sqrt{8} \times P$ in the Y-direction. The contact CB2 is disposed at a position overlapping with the line-shaped region AA2 when seen through in the Z-direction. The contact CB2 has a substantially elliptical shape whose major axis is set along the Y-direction, for example.

The contact CB3 is disposed at a position that is shifted from the contact CB1 by a distance approximately of 2P in the X-direction and by a distance approximately of $\sqrt{8} \times P/2$ in the Y-direction. The contact CB3 is disposed at a position overlapping with the line-shaped region AA3 when seen through in the Z-direction. The contact CB3 has a substantially elliptical shape whose major axis is set along the Y-direction, for example.

The contact CB4 is disposed at a position that is shifted from the contact CB1 by a distance approximately of 3P in the X-direction. The contact CB4 is disposed at a position overlapping with the line-shaped region AA4 when seen through in the Z-direction. The contact CB4 has a substantially elliptical shape whose major axis is set along the Y-direction, for example.

The contact CB5 is disposed at a position that is shifted from the contact CB4 by a distance approximately of P in the X-direction and by a distance approximately of $\sqrt{8} \times P$ in the Y-direction. The contact CB5 is disposed at a position overlapping with the line-shaped region AA5 when seen through in the Z-direction. The contact CB5 has a substantially elliptical shape whose major axis is set along the Y-direction, for example.

The contact CB6 is disposed at a position that is shifted from the contact CB5 by a distance approximately of 2P in the X-direction and by a distance approximately of $\sqrt{8} \times P/2$ in the Y-direction. The contact CB6 is disposed at a position overlapping with the line-shaped region AA6 when seen through in the Z-direction. The contact CB6 has a substantially elliptical shape whose major axis is set along the Y-direction, for example.

The contact CB7 is disposed at a position that is shifted from the contact CB5 by a distance approximately of 3P in the X-direction. The contact CB7 is disposed at a position overlapping with the line-shaped region AA7 when seen through in the Z-direction. The contact CB7 has a substantially elliptical shape whose major axis is set along the Y-direction, for example.

The contact CB8 is disposed at a position that is shifted from the contact CB7 by a distance approximately of P in the X-direction and by a distance approximately of $\sqrt{8} \times P$ in the Y-direction. The contact CB8 is disposed at a position overlapping with the line-shaped region AA8 when seen through in the Z-direction. The contact CB8 has a substantially elliptical shape whose major axis is set along the Y-direction, for example.

For example, if the arrangement position of the contact CB1 is set at the original point (0,0), the arrangement positions of the contacts CB2, CB4, CB5, CB7, and CB8 respectively become present at $(P, -\sqrt{8} \times P)$, $(3P, 0)$, $(4P, -\sqrt{8} \times P)$, $(6P, 0)$, and $(7P, -\sqrt{8} \times P)$.

In this layout configuration, the minimum distance between the contacts CB1 to CB8 can be smaller than the resolution limit pitch 3P. For example, the distance between the contact CB1 and the contact CB3 can be smaller than 3P. The distance between the contact CB2 and the contact CB3 can be smaller than 3P. The distance between the contact CB3 and the contact CB4 can be smaller than 3P. The distance between the contact CB3 and the contact CB5 can be smaller than 3P.

As described above, according to this embodiment, the manufacturing method of the semiconductor device 1 includes arranging light shielding patterns onto the mask MK, such that the light shielding patterns respectively correspond to the contacts CB1, CB2, CB4, CB5, CB7, and CB8 selected from the contacts CB1 to CB8 to be arranged in a triple dot zigzag arrangement with excluding the contacts CB3 and CB6 to be arranged each at the intermediate position of a series of three contacts. Thereafter, light exposure is performed by use of this mask MK, and then double development is performed, so that the contacts CB1, CB2, CB4, CB5, CB7, and CB8, whose corresponding patterns are arranged on the mask MK, and the contacts CB3 and CB6, whose corresponding patterns are not arranged on the mask MK, are respectively developed. Consequently, the minimum distance of the contacts CB1 to CB8 arranged in a triple dot zigzag arrangement can be made smaller than the resolution limit pitch 3P in association with a single development step. As a result, the arrangement area for the contacts (bit line contacts) CB1 to CB8 can be reduced in the Y-direction, so that the interval between the two selection gate lines SGL1 can be set narrower, and the increase of the chip surface area can be suppressed.

It should be noted that the embodiment described above has taken as an example a case that the double development (S10) is set to first perform the positive development (S11) and then perform the negative development (S12), as shown in FIG. 4, but the double development (S10) may be set to first perform the negative development (S12) and then perform the positive development (S11).

Figure 11A:
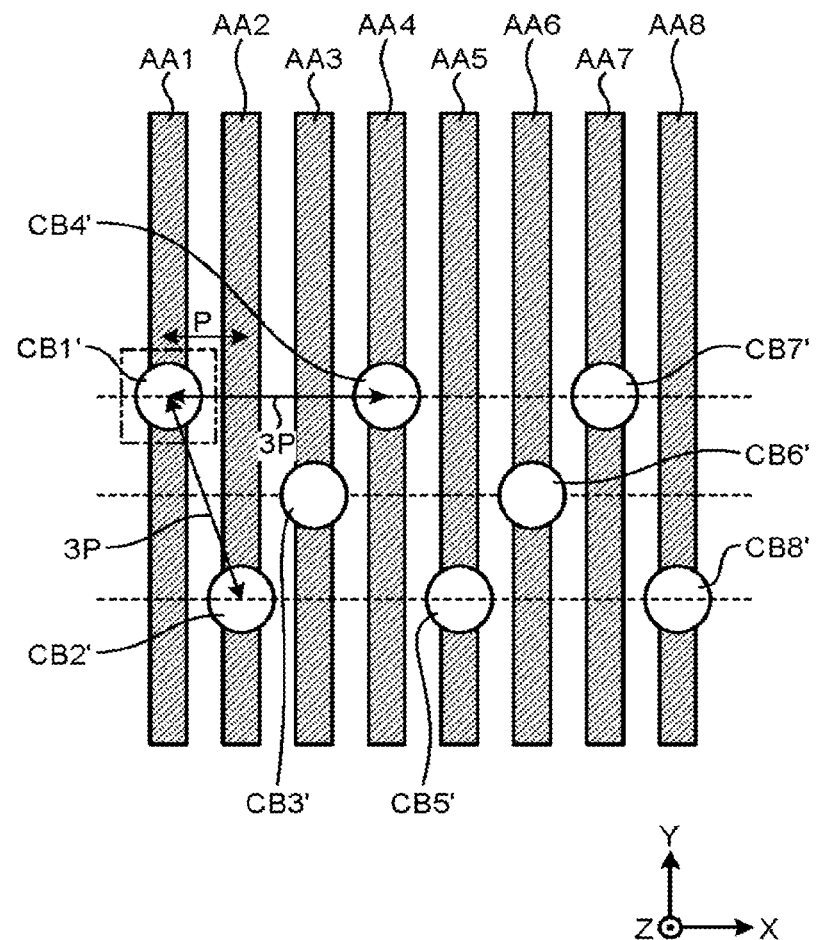
FIGS. 11A and 11B are plan views showing a layout configuration of contacts according to a modification of the embodiment.
Figure 11B:
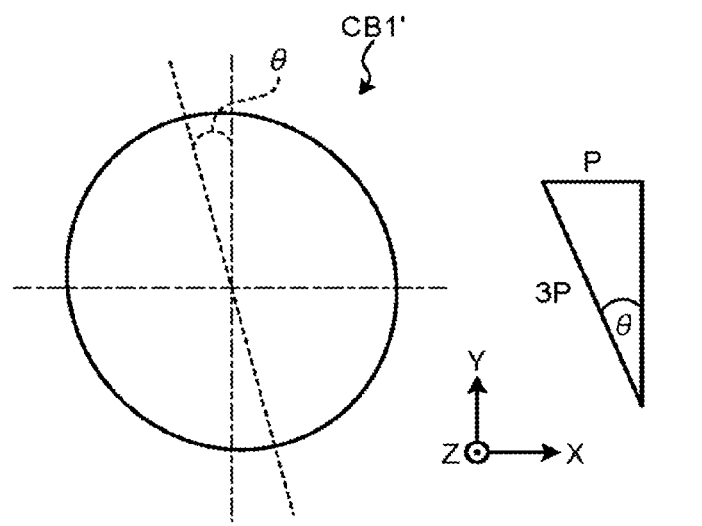

Alternatively, as shown in FIGS. 11A and 11B, in place of having a substantially elliptical shape whose major axis is set along the Y-direction, each of contacts CB1' to CB8' may have a substantially elliptical shape with its major axis inclined relative to the Y-direction depending on the arrangement position of each of the contacts CB1' to CB8'. FIG. 11A is a plan view showing a layout configuration of contacts. FIG. 11B is an enlarged plan view showing the shape of a contact. For example, the line segment connecting the center of the contact CB1' to the center of the contact CB2' is inclined by an angle of e relative to the Y-direction. In accordance with this, each of the contacts CB1' to CB8' may have a substantially elliptical shape with its major axis inclined by an angle of θ relative to the Y-direction. Consequently, the light exposure amount distribution near development patterns (opening patterns OP3 and OP6) corresponding to the contacts CB3 and CB6 can be modified to be smoother, and the shapes of the development patterns (opening patterns OP3 and OP6) can thereby be more refined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first line-shaped region;
   a second line-shaped region juxtaposed to the first line-shaped region at a pitch approximately of P in a first direction;
   a third line-shaped region juxtaposed to the second line-shaped region at a pitch approximately of P in the first direction;
   a fourth line-shaped region juxtaposed to the third line-shaped region at a pitch approximately of P in the first direction;
   a fifth line-shaped region juxtaposed to the fourth line-shaped region at a pitch approximately of P in the first direction;
   a first contact overlapping with the first line-shaped region when seen through in a direction perpendicular to a substrate;
   a second contact disposed at a position that is shifted from the first contact by a distance approximately of P in the first direction and by a distance approximately of $\sqrt{8} \times P$ in a second direction, the second contact overlapping with the second line-shaped region when seen through in a direction perpendicular to the substrate;
   a third contact disposed at a position that is shifted from the first contact by a distance approximately of 2P in the first direction and by a distance approximately of $\sqrt{8} \times P/2$ in the second direction, the third contact overlapping with the third line-shaped region when seen through in a direction perpendicular to the substrate;
   a fourth contact disposed at a position that is shifted from the first contact by a distance approximately of 3P in the first direction, the fourth contact overlapping with the fourth line-shaped region when seen through in a direction perpendicular to the substrate; and
   a fifth contact disposed at a position that is shifted from the fourth contact by a distance approximately of P in the first direction and by a distance approximately of $\sqrt{8} \times P$ in the second direction, the fifth contact overlapping with the fifth line-shaped region when seen through in a direction perpendicular to the substrate.

2. The semiconductor device according to claim 1, the semiconductor device further comprising:
   a sixth line-shaped region juxtaposed to the fifth line-shaped region at a pitch approximately of P in the first direction;
   a seventh line-shaped region juxtaposed to the sixth line-shaped region at a pitch approximately of P in the first direction;
   an eighth line-shaped region juxtaposed to the seventh line-shaped region at a pitch approximately of P in the first direction;
   a sixth contact disposed at a position that is shifted from the fourth contact by a distance approximately of 2P in the first direction and by a distance approximately of $\sqrt{8} \times P/2$ in the second direction, the sixth contact overlapping with the sixth line-shaped region when seen through in a direction perpendicular to the substrate;
   a seventh contact disposed at a position that is shifted from the fourth contact by a distance approximately of 3P in the first direction, the seventh contact overlapping with the seventh line-shaped region when seen through in a direction perpendicular to the substrate; and
   an eighth contact disposed at a position that is shifted from the seventh contact by a distance approximately of P in the first direction and by a distance approximately of $\sqrt{8} \times P$ in the second direction, the eighth contact overlapping with the eighth line-shaped region when seen through in a direction perpendicular to the substrate.

3. The semiconductor device according to claim 1, wherein
   the first contact, the second contact, the third contact, the fourth contact, and the fifth contact have a shape formed along a line segment connecting a center of the first contact to a center of the second contact when seen through in a direction perpendicular to the substrate.

4. The semiconductor device according to claim 3, wherein
   the first contact, the second contact, the third contact, the fourth contact, and the fifth contact have a substantially elliptical shape whose major axis is set along a line segment connecting a center of the first contact to a center of the second contact when seen through in a direction perpendicular to the substrate.

5. The semiconductor device according to claim 2, wherein
   the sixth contact, the seventh contact, and the eighth contact have a shape formed along a line segment connecting a center of the first contact to a center of the second contact when seen through in a direction perpendicular to the substrate.

6. The semiconductor device according to claim 5, wherein
   the sixth contact, the seventh contact, and the eighth contact have a substantially elliptical shape whose major axis is set along a line segment connecting a center of the first contact to a center of the second contact when seen through in a direction perpendicular to the substrate.

7. The semiconductor device according to claim 1, the semiconductor device further comprising:

a first bit line overlapping with the first contact and the first line-shaped region when seen through in a direction perpendicular to the substrate;

a second bit line overlapping with the second contact and the second line-shaped region when seen through in a direction perpendicular to the substrate;

a third bit line overlapping with the third contact and the third line-shaped region when seen through in a direction perpendicular to the substrate;

a fourth bit line overlapping with the fourth contact and the fourth line-shaped region when seen through in a direction perpendicular to the substrate; and a fifth bit line overlapping with the fifth contact and the fifth line-shaped region when seen through in a direction perpendicular to the substrate.

8. The semiconductor device according to claim 2, the semiconductor device further comprising:

a sixth bit line overlapping with the sixth contact and the sixth line-shaped region when seen through in a direction perpendicular to the substrate;

a seventh bit line overlapping with the seventh contact and the seventh line-shaped region when seen through in a direction perpendicular to the substrate; and an eighth bit line overlapping with the eighth contact and the eighth line-shaped region when seen through in a direction perpendicular to the substrate.

9. A manufacturing method of a semiconductor device, the method comprising:

forming, on a substrate, a first line-shaped region, a second line-shaped region juxtaposed to the first line-shaped region at a pitch approximately of P in a first direction, a third line-shaped region juxtaposed to the second line-shaped region at a pitch approximately of P in the first direction, a fourth line-shaped region juxtaposed to the third line-shaped region at a pitch approximately of P in the first direction, and a fifth line-shaped region juxtaposed to the fourth line-shaped region at a pitch approximately of P in the first direction; and performing double development and forming, on the substrate, a first contact overlapping with the first line-shaped region when seen through in a direction perpendicular to a substrate, a second contact disposed at a position that is shifted from the first contact by a distance approximately of P in the first direction and by a distance approximately of $\sqrt{8}\times P$ in a second direction such that the second contact overlaps with the second line-shaped region when seen through in a direction perpendicular to the substrate, a third contact disposed at a position that is shifted from the first contact by a distance approximately of 2P in the first direction and by a distance approximately of $\sqrt{8}\times P/2$ in the second direction such that the third contact overlaps with the third line-shaped region when seen through in a direction perpendicular to the substrate, a fourth contact disposed at a position that is shifted from the first contact by a distance approximately of 3P in the first direction such that the fourth contact overlaps with the fourth line-shaped region when seen through in a direction perpendicular to the substrate, and a fifth contact disposed at a position that is shifted from the fourth contact by a distance approximately of P in the first direction and by a distance approximately of $\sqrt{8}\times P$ in the second direction such that the fifth contact overlaps with the fifth line-shaped region when seen through in a direction perpendicular to the substrate.

10. The manufacturing method of a semiconductor device according to claim 9, wherein the double development further includes applying a photosensitive material onto the substrate, after formation of the first line-shaped region, the second line-shaped region, the third line-shaped region, the fourth line-shaped region, and the fifth line-shaped region, and forming latent image patterns on the photosensitive material by use of a mask including patterns corresponding to the first contact, the second contact, the fourth contact, and the fifth contact.

11. The manufacturing method of a semiconductor device according to claim 9, wherein the double development includes forming development patterns corresponding to the first contact, the second contact, the fourth contact, and the fifth contact in the photosensitive material by use of a first liquid developer, forming a development pattern corresponding to the third contact in the photosensitive material by use of a second liquid developer, and forming the first contact, the second contact, the third contact, the fourth contact, and the fifth contact in the substrate, through the development patterns corresponding to the first contact, the second contact, the fourth contact, and the fifth contact, and the development pattern corresponding to the third contact.

12. The manufacturing method of a semiconductor device according to claim 10, wherein the mask does not include a pattern corresponding to the third contact.

13. The manufacturing method of a semiconductor device according to claim 11, wherein the first liquid developer is a liquid developer to obtain a positive type pattern, and the second liquid developer is a liquid developer to obtain a negative type pattern.

14. The manufacturing method of a semiconductor device according to claim 9, wherein formation of the first line-shaped region, the second line-shaped region, the third line-shaped region, the fourth line-shaped region, and the fifth line-shaped region further includes forming, on the substrate, a sixth line-shaped region juxtaposed to the fifth line-shaped region at a pitch approximately of P in the first direction, a seventh line-shaped region juxtaposed to the sixth line-shaped region at a pitch approximately of P in the first direction, and an eighth line-shaped region juxtaposed to the seventh line-shaped region at a pitch approximately of P in the first direction, and wherein the double development further includes forming, on the substrate, a sixth contact disposed at a position that is shifted from the fourth contact by a distance approximately of 2P in the first direction and by a distance approximately of $\sqrt{8}\times P/2$ in the second direction such that the sixth contact overlaps with the sixth line-shaped region when seen through in a direction perpendicular to the substrate, a seventh contact disposed at a position that is shifted from the fourth contact by a distance approximately of 3P in the first direction such that the seventh contact overlaps with the seventh line-shaped region when seen through in a direction perpendicular to the substrate, and an eighth contact disposed at a position that is shifted from the seventh contact by a distance approximately of P in the first direction and by a distance approximately of $\sqrt{8} \times P$ in the second direction such that the eighth contact overlaps with the eighth line-shaped region when seen through in a direction perpendicular to the substrate.

15. The manufacturing method of a semiconductor device according to claim 9, wherein formation of the first contact, the second contact, the third contact, the fourth contact, and the fifth contact includes forming, on the substrate, the first contact, the second contact, the third contact, the fourth contact, and the fifth contact to have a shape formed along a line segment connecting a center of the first contact to a center of the second contact when seen through in a direction perpendicular to the substrate.

16. The manufacturing method of a semiconductor device according to claim 15, wherein formation of the first contact, the second contact, the third contact, the fourth contact, and the fifth contact includes forming, on the substrate, the first contact, the second contact, the third contact, the fourth contact, and the fifth contact to have a substantially elliptical shape whose major axis is set along a line segment connecting a center of the first contact to a center of the second contact when seen through in a direction perpendicular to the substrate.

17. The manufacturing method of a semiconductor device according to claim 14, wherein formation of the sixth contact, the seventh contact, and the eighth contact includes forming, on the substrate, the sixth contact, the seventh contact, and the eighth contact to have a shape formed along a line segment connecting a center of the first contact to a center of the second contact when seen through in a direction perpendicular to the substrate.

18. The manufacturing method of a semiconductor device according to claim 17, wherein formation of the sixth contact, the seventh contact, and the eighth contact includes forming, on the substrate, the sixth contact, the seventh contact, and the eighth contact to have a substantially elliptical shape whose major axis is set along a line segment connecting a center of the first contact to a center of the second contact when seen through in a direction perpendicular to the substrate.

19. The manufacturing method of a semiconductor device according to claim 9, the method further comprising forming, on the substrate, a first bit line overlapping with the first contact and the first line-shaped region when seen through in a direction perpendicular to the substrate, a second bit line overlapping with the second contact and the second line-shaped region when seen through in a direction perpendicular to the substrate, a third bit line overlapping with the third contact and the third line-shaped region when seen through in a direction perpendicular to the substrate, a fourth bit line overlapping with the fourth contact and the fourth line-shaped region when seen through in a direction perpendicular to the substrate, and a fifth bit line overlapping with the fifth contact and the fifth line-shaped region when seen through in a direction perpendicular to the substrate.

20. The manufacturing method of a semiconductor device according to claim 10, the method further comprising forming, on the substrate, a sixth bit line overlapping with the sixth contact and the sixth line-shaped region when seen through in a direction perpendicular to the substrate, a seventh bit line overlapping with the seventh contact and the seventh line-shaped region when seen through in a direction perpendicular to the substrate, and an eighth bit line overlapping with the eighth contact and the eighth line-shaped region when seen through in a direction perpendicular to the substrate.

\* \* \* \* \*